(12) United States Patent
Jiang et al.

(10) Patent No.: US 8,236,389 B2
(45) Date of Patent: Aug. 7, 2012

(54) METHOD FOR MAKING CARBON NANOTUBE FILMS

(75) Inventors: Kai-Li Jiang, Beijing (CN); Qun-Qing Li, Beijing (CN); Liang Liu, Beijing (CN); Shou-Shan Fan, Beijing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 822 days.

(21) Appl. No.: 12/291,305

(22) Filed: Nov. 6, 2008

(65) Prior Publication Data

US 2009/0297732 A1 Dec. 3, 2009

(30) Foreign Application Priority Data

May 28, 2008 (CN) .......................... 2008 1 0067529

(51) Int. Cl.
*C23C 16/56* (2006.01)

(52) U.S. Cl. .................. 427/585; 427/255.28; 427/333; 427/249.1; 977/843

(58) Field of Classification Search ............. 427/255.28, 427/585, 333, 249.1; 977/483
See application file for complete search history.

(56) References Cited

U.S. PATENT DOCUMENTS

| | | | |
|---|---|---|---|
| 2003/0096104 A1 | 5/2003 | Tobita et al. | |
| 2004/0105807 A1 | 6/2004 | Fan et al. | |
| 2007/0013287 A1 | 1/2007 | Huang et al. | |
| 2008/0039557 A1 | 2/2008 | Li et al. | |
| 2008/0054790 A1* | 3/2008 | Kim et al. | 313/491 |
| 2009/0153513 A1* | 6/2009 | Liu et al. | 345/173 |
| 2011/0262772 A1* | 10/2011 | Hauge et al. | 428/688 |

FOREIGN PATENT DOCUMENTS

| | | |
|---|---|---|
| CN | 1504407 A | 6/2004 |
| CN | 101121497 A | 2/2008 |
| JP | 2002-273741 | 9/2002 |
| JP | 2002-329723 | 11/2002 |
| JP | 2006-172662 | 6/2006 |
| JP | 2007-27087 | 2/2007 |
| JP | 2008-44099 | 2/2008 |

\* cited by examiner

*Primary Examiner* — Queenie Dehghan
(74) *Attorney, Agent, or Firm* — Altis Law Group, Inc.

(57) ABSTRACT

A method for making a carbon nanotube film, the method comprising the following steps of: (a) supplying a substrate; (b) forming at least one strip-shaped catalyst film on the substrate, a width of the strip-shaped catalyst films ranging from approximately 1 micrometer to 20 micrometers; (c) growing at least one strip-shaped carbon nanotube array on the substrate using a chemical vapor deposition method; and (d) causing the at least one strip-shaped carbon nanotube array to fold along a direction parallel to a surface of the substrate, thus forming at least one carbon nanotube film.

15 Claims, 3 Drawing Sheets

METHOD FOR MAKING CARBON NANOTUBE FILMS

BACKGROUND

1. Field of the Invention

The present invention relates to a method for making a strip-shaped carbon nanotube film.

2. Discussion of Related Art

Carbon nanotubes (CNT) are a carbonaceous material and have received much interest since the early 1990s. Carbon nanotubes have interesting and potentially useful electrical and mechanical properties. Due to these and other properties, CNTs have become a significant focus of research and development for use in electron emitting devices, sensors, and transistors, among other devices.

Generally, the carbon nanotubes, prepared by conventional methods, are particles or powder. The particle/powder-shaped carbon nanotubes limit the number applications they can be used in. Thus, preparation of macroscopic carbon nanotube structures has attracted lots of attention.

Carbon nanotube film is one of the important macroscopic carbon nanotube structures. Conventionally, a method for making a carbon nanotube film includes the following steps of: supplying a substrate; depositing a catalyst film on the substrate; supplying a reaction chamber; placing the substrate with the catalyst film thereon in the reaction chamber; and introducing carbon source gas and heating the substrate to grow carbon nanotube films. The carbon nanotube films, formed on the substrate, include a plurality of carbon nanotubes entangled with each other and disorderly distributed therein.

However, the carbon nanotube film, grown by the above-described method, has the following disadvantages: firstly, since the substrate has the catalyst film thereon, the carbon nanotube film grown on the substrate has catalyst therein, thus the carbon nanotube film is impure; secondly, a plurality of carbon nanotubes in the carbon nanotube film are entangled with each other and disorderly distributed, which is not conducive to taking best advantage of the properties of carbon nanotubes, such as desirable electrical and thermal conductivity characteristics.

What is needed, therefore, is a method for making a carbon nanotube film, and the carbon nanotube film has no catalyst, the carbon nanotubes therein aligned ordered, and is conducive to acquire excellent properties of the carbon nanotube film.

BRIEF DESCRIPTION OF THE DRAWINGS

Many aspects of the present method for making a carbon nanotube film can be better understood with references to the following drawings. The components in the drawings are not necessarily drawn to scale, the emphasis instead being placed upon clearly illustrating the principles of the present method for making a carbon nanotube film.

Corresponding reference characters indicate corresponding parts throughout the views. The exemplifications set out herein illustrate at least one embodiment of the present method for making a carbon nanotube film, in accordance with the present embodiment.

DETAILED DESCRIPTION OF EXEMPLARY EMBODIMENTS

References will now be made to the drawings to describe, in detail, embodiments of the present method for making a carbon nanotube film.

Figure 1:
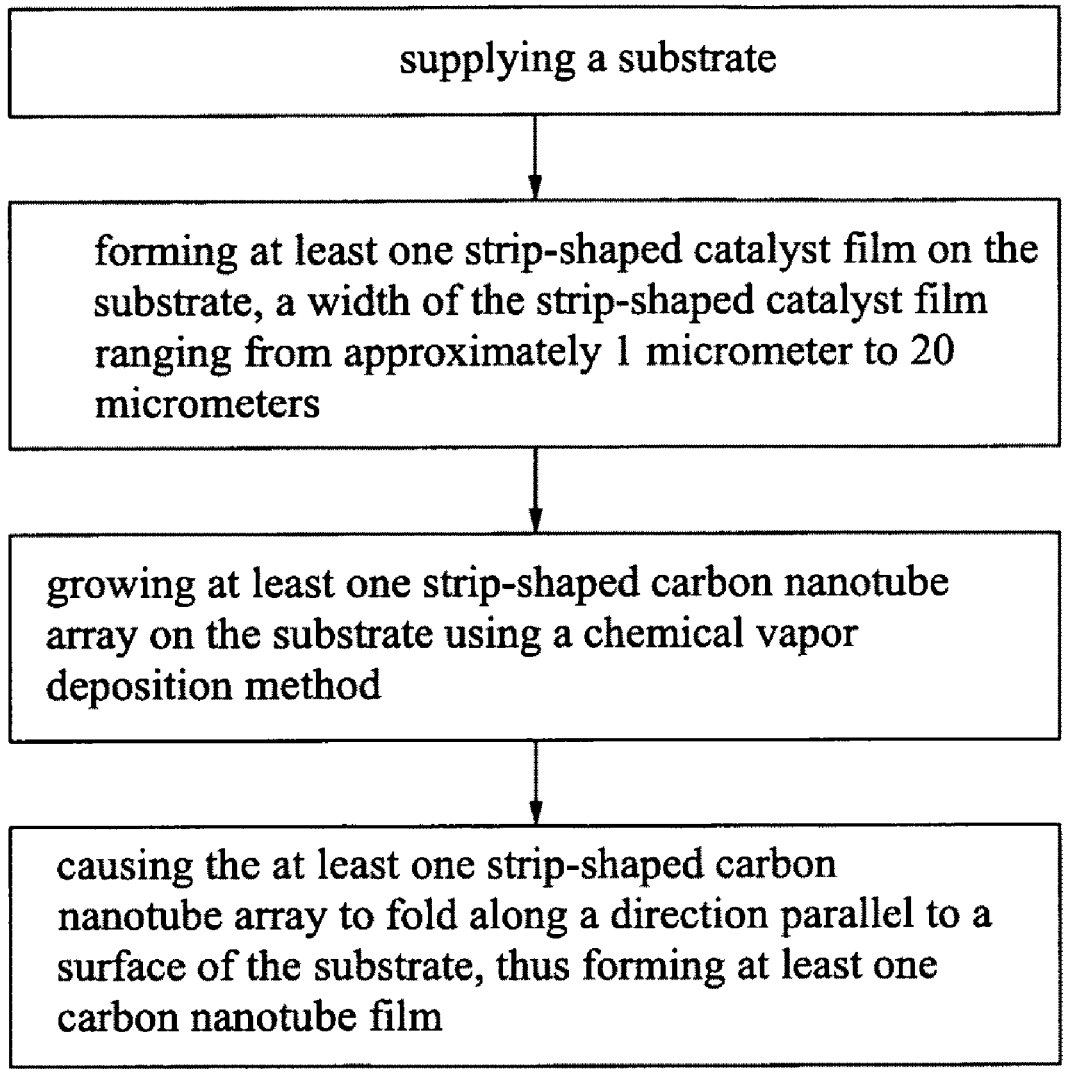
FIG. 1 is a flow chart of a method for making a carbon nanotube film, in accordance with the present embodiment.

Referring to FIG. 1, a method for making a carbon nanotube film, the method comprising the following steps of: (a) supplying a substrate; (b) forming at least one strip-shaped catalyst film on the substrate; (c) growing at least one strip-shaped carbon nanotube array on the substrate using a chemical vapor deposition method; and (d) causing the at least one strip-shaped carbon nanotube array to fold along a direction parallel to a surface of the substrate, thus forming at least one carbon nanotube film.

In step (a), the substrate is a high temperature resistant substrate. A material of the substrate can be any kind of material with a melting point higher than the growing temperature of carbon nanotubes. The substrate can be square, round, or other shapes. A size of the substrate is not limited. In the present embodiment, the substrate is a square silicon substrate, and has a width and a length of 30 centimeters.

In step (b), the strip-shaped catalyst film is used to grow carbon nanotubes. A material of the strip-shaped catalyst film can be selected from a group consisting of iron, cobalt, nickel and any combination thereof. In this embodiment, the material of the strip-shaped catalyst film is iron. The strip-shaped catalyst film can be formed by a thermal deposition method, an electron beam deposition method or a sputtering method. The strip-shaped catalyst film also can be formed by a light eroding method or a masking method. A distance between the strip-shaped catalyst films approximately ranges from 10 micrometers to 5 millimeters. A length of the strip-shaped catalyst films is not limited. A width of the strip-shaped catalyst film is less than 20 micrometers. A thickness thereof approximately ranges from 0.1 nanometers to 10 nanometers. The length of the catalyst film can be at least 20 times the width. In the present embodiment, the width of the strip-shaped catalyst film approximately ranges from 1 micrometer to 20 micrometers.

Step (c) includes the following steps of: (c1) placing the substrate with the at least one strip-shaped catalyst film thereon into a chamber; (c2) introducing a protective gas to discharge the air in the chamber; (c3) heating the chamber to 600° C.-900° C. with the protective gas therein and sustaining the temperature; and (c4) introducing a gas mixture with a ratio of carbon source gas and carrying gas ranging from 1:30 to 1:3 for 5 to 30 minutes to grow the strip-shaped carbon nanotube array. Step (c) further includes a step (c5) of ceasing heating the chamber, and removing the substrate with the strip-shaped carbon nanotube array thereon once the substrate has cooled to room temperature.

The protective gas can be made up of at least one of nitrogen ($N_2$), ammonia ($NH_3$), and a noble gas. The carbon source gas can be a hydrocarbon gas, such as ethylene ($C_2H_4$), methane ($CH_4$), acetylene ($C_2H_2$), ethane ($C_2H_6$), or any combination thereof. The carrying gas can be hydrogen gas.

A flow of the carbon source gas approximately ranges from 20 to 200 sccm. A flow of the carrying gas approximately ranges from 50 to 600 sccm. The protective gas is continuously introduced until the temperature of the chamber being room temperature to prevent oxidation of the carbon nanotubes. In the present embodiment, the protective gas is argon gas, and the carbon source gas is acetylene. A temperature of the chamber for growing carbon nanotube array is 800° C. The gas mixture is introduced for 60 minutes.

The properties of the carbon nanotubes in the carbon nanotube array, such as diameters thereof, and the properties of carbon nanotube film, such as, transparency and resistance thereof can be adjusted by regulating the ratio of the carbon source gas and carrier gas. In the present embodiment, a single-walled carbon nanotube array can be prepared when the ratio of the carbon source gas and the carrier gas approximately ranges from 1:100 to 10:100. A double-walled or multi-walled carbon nanotube array can be acquired when the ratio of the carbon source gas and the carrier gas is increased. The carbon nanotubes in the carbon nanotube array can be selected from a group consisting of single-walled carbon nanotubes, double-walled carbon nanotubes or multi-walled carbon nanotubes. Diameters of the single-walled carbon nanotubes approximately range from 0.5 to 50 nanometers. Diameters of the double-walled carbon nanotubes approximately range from 1 to 50 nanometers. Diameters of the multi-walled carbon nanotubes approximately range from 1.5 to 50 nanometers.

Figure 2:
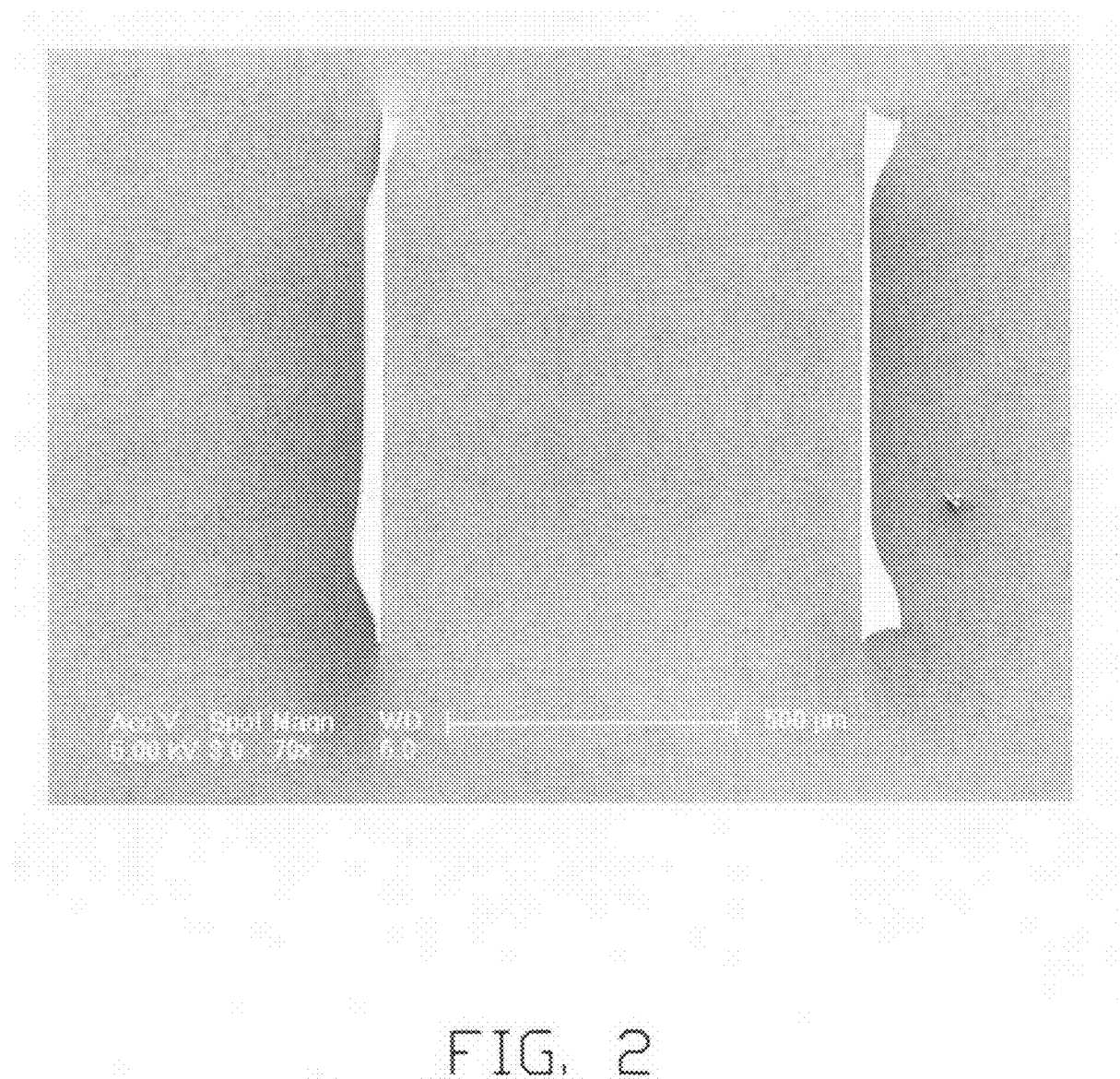
FIG. 2 shows a Scanning Electron Microscope (SEM) image of at least one carbon nanotube array, in accordance with the present embodiment.

A height of the carbon nanotube array is increased with the longer introduced time of the gas mixture. In the present embodiment, the height of the carbon nanotube array approximately ranges from 1 millimeter to 10 millimeters. The height of the carbon nanotube array can be approximately ranges from 1 millimeter to 2 millimeters when the gas mixture is introduced for 60 minutes. An SEM image of the carbon nanotube array can be seen in FIG. 2.

A distance between the strip-shaped catalyst films is related to a height of the carbon nanotube array. The higher the height of the carbon nanotube array, the larger the distance between the strip-shaped catalyst films. Whereas the lower the height of the carbon nanotube array, the smaller the distance between the strip-shaped catalyst films. In the present embodiment, the distance between the strip-shaped catalyst films is a little larger than the height of the carbon nanotube array, and approximately ranges from 10 micrometers to 15 millimeters. The carbon nanotube films are parallel with each other and are uniformly spaced. It can be understood that the distance between the strip-shaped catalyst films also can be smaller than the height of the carbon nanotube array.

The carbon nanotube array formed under the above conditions is essentially free of impurities such as carbonaceous or residual catalyst particles. The carbon nanotubes in the carbon nanotube array are closely packed together by van der Waals attractive force therebetween.

Step (d) can be executed by an organic solvent treating method, a mechanical force treating method, or an air current treating method. Step (d), executed by the organic solvent treating method, includes the following steps of: (d1) supplying a container with an organic solvent therein; (d2) immersing the substrate with the at least one carbon nanotube array thereon into the organic solvent; and (d3) removing the substrate from the organic solvent along a direction parallel to a surface of the substrate. The strip-shaped carbon nanotube array is pressed down on the substrate because of the surface tension of the organic solvent to form at least one carbon nanotube films. The organic solvent can be selected from a group consisting of ethanol, methanol, acetone, chloroform, and dichloroethane. In the present embodiment, the organic solvent is ethanol. The carbon nanotube films are adhered on the surface of the substrate, and have a reduced specific surface area. The mechanical strength and toughness of the carbon nanotube film are increased, while, the stickiness thereof is reduced.

Step (d), executed by mechanical force treating method, includes the following steps of: (d1') providing a pressing device; and (d2') pressing the strip-shaped carbon nanotube array along a direction parallel to a surface of the substrate by the pressing device, the pressed strip-shaped carbon nanotube array forming at least one strip-shaped carbon nanotube film.

The pressing device can be, e.g., a pressure head with a glossy surface. In the present embodiment, the pressure head is a roller-shaped pressure head. It can be understood that any pressing device that can press the strip-shaped carbon nanotube array down on the substrate can be used as the pressing device. The at least one carbon nanotube array, under the pressure applied by the pressing device, depart from the substrate and form at least one free-standing carbon nanotube films.

Step (d), executed by the air current treating method, includes the following steps of: (d1") supplying an air device; and (d2") applying an air current by the air device to the at least one carbon nanotube array along a direction parallel to a surface of the substrate, the strip-shaped carbon nanotube array pressed down on the substrate to form at least one carbon nanotube film. The air device can be any device that can produce an air current. In the present embodiment, the air device is a Fan.

A density of the carbon nanotube film is related to a width of the strip-shaped catalyst film. The larger the width of the strip-shaped catalyst film, the larger the density of the carbon nanotube film. Whereas, the smaller the width of the strip-shaped catalyst film, the smaller the density of the carbon nanotube film. In the present embodiment, the width of the carbon nanotube film approximately ranges from 1 micrometer to 20 micrometers.

Another embodiment includes a step (e), executed by an etching method, to make the resulting carbon nanotube film have a higher purity. Step (e) includes the following steps of: (e1) coating a layer of photoresist on the strip-shaped carbon nanotube array fold down on the substrate; (e2) removing the photoresist on the strip-shaped catalyst film through an exposure method or a contrast method; (e3) removing the strip-shaped catalyst film, by a plasma etching method; and (e4) removing the photoresist on the residual strip-shaped carbon nanotube array fold down on the substrate. The acquired carbon nanotube films are essentially free of impurities such as catalyst particles.

Figure 3:
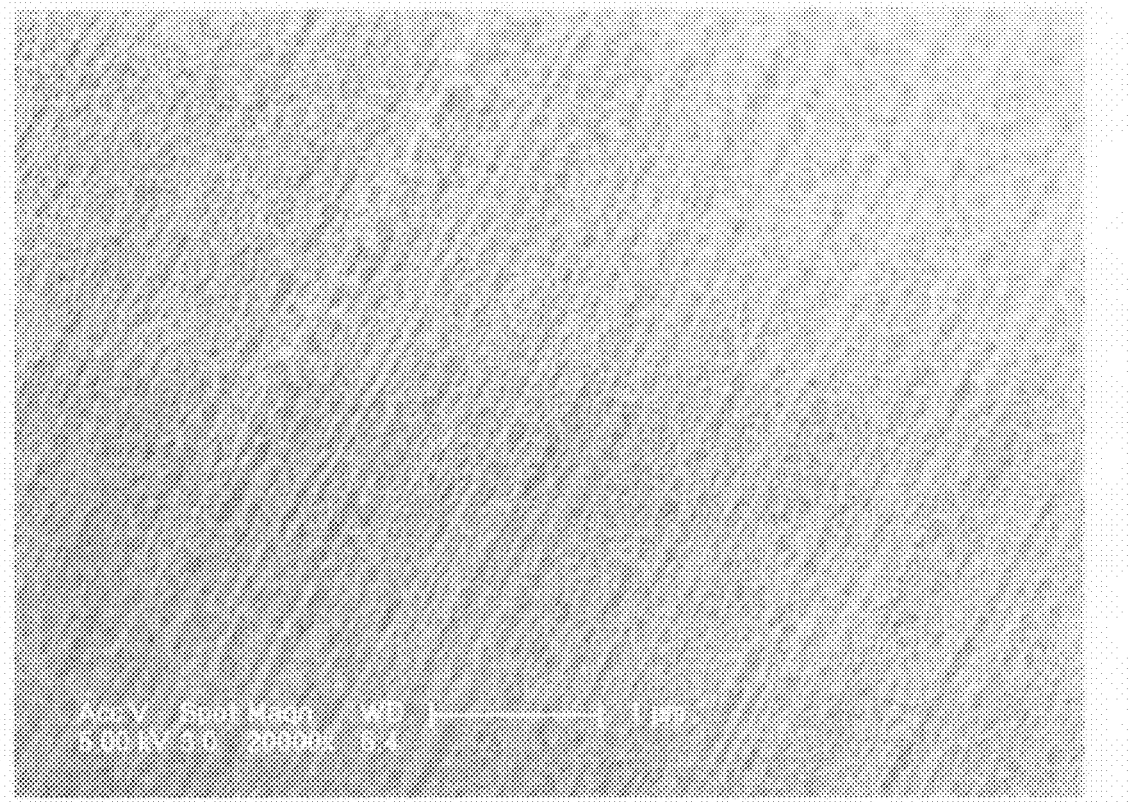
FIG. 3 shows a Scanning Electron Microscope (SEM) image of the carbon nanotube film, in accordance with the present embodiment.

Referring to FIG. 3, the carbon nanotube film includes a plurality of carbon nanotubes arranged along a preferred orientation. The carbon nanotubes are parallel with each other, have almost equal length and are combined by van der Waals attractive force therebetween. A length of the carbon nanotubes can reach up to several millimeters. In the present embodiment, the length of the carbon nanotubes can range approximately from 1 millimeter to 10 millimeters. The carbon nanotube films have a plurality of excellent properties, such as electricity conductive property and thermal conductive property, and can be used in a variety of fields, such as thin film transistor, thermal interface material and so on.

Compared to conventional technologies, the method for making the carbon nanotube film provided by the present embodiments has many advantages including the following. Firstly, since the at least one carbon nanotube film is formed by putting the at least one catalyst film in a chamber to grow at least one carbon nanotube array and then treating the at least one carbon nanotube array, the method is simple, and can realize mass product of the carbon nanotube films. Secondly, since the length of the carbon nanotubes can reach up to several millimeters, the carbon nanotube films, composed of the carbon nanotubes, have a plurality of excellent properties, such as electricity conductive property and thermal conductive property, and can be used in a variety of fields. Finally, the acquired carbon nanotube films are essentially free of impurities such as residual catalyst particles.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

It is also to be understood that the above description and the claims drawn to a method may include some indication in reference to certain steps. However, the indication used is only to be viewed for identification purposes and not as a suggestion as to an order for the steps.

What is claimed is:

1. A method for making a carbon nanotube film, the method comprising the following steps of:
    (a) supplying a substrate having a growing surface;
    (b) forming at least one strip-shaped catalyst film on the growing surface of the substrate, a width of the strip-shaped catalyst film ranging from approximately 1 micrometer to 20 micrometers;
    (c) growing at least one strip-shaped carbon nanotube array on the substrate using a chemical vapor deposition method, wherein a growing direction of the at least one strip-shaped carbon nanotube array is perpendicular to the growing surface;
    (d) causing the at least one strip-shaped carbon nanotube array to fall down on the growing surface along a direction parallel to a surface of the substrate, thus forming the carbon nanotube film adhered on the surface of the substrate;
    (e1) coating a layer of photoresist on the strip-shaped catalyst film and the strip-shaped carbon nanotube array fell down on the growing surface of the substrate;
    (e2) removing the photoresist on the strip-shaped catalyst film through an exposure method or a contrast method;
    (e3) removing the strip-shaped catalyst film by a plasma etching method; and
    (e4) removing the photoresist on the residual strip-shaped carbon nanotube array that has fallen down on the growing surface of the substrate.

2. The method as claimed in claim 1, wherein a material of the catalyst film is selected from the group consisting of iron, cobalt, nickel and any combination thereof.

3. The method as claimed in claim 1, wherein step (b) further comprises a thermal deposition method, an electron beam deposition method or a sputtering method.

4. The method as claimed in claim 1, wherein step (b) further comprises a step of forming at least two separated strip-shaped catalyst films parallel with each other.

5. The method as claimed in claim 4, wherein a distance between the strip-shaped catalyst films ranges from approximately 10 micrometers to 5 millimeters.

6. The method as claimed in claim 1, wherein step (c) further comprises the following steps of:
    (c1) placing the substrate with the at least one strip-shaped catalyst film thereon into a chamber;
    (c2) introducing a protective gas to discharge the air in the chamber;
    (c3) heating the chamber to 600° C.-900° C. with the protective gas therein and sustaining the temperature; and
    (c4) introducing a gas mixture with a ratio of carbon source gas and carrying gas ranging from 1:30 to 1:3 for 5 to 30 minutes, wherein a carbon source gas flow approximately ranges from 20 to 200 sccm, a carrying gas flow approximately ranges from 50 to 600 sccm.

7. The method as claimed in claim 6, wherein step (c) further comprises a step of cooling the substrate with the at least one strip-shaped carbon nanotube array thereon.

8. The method as claimed in claim 1, wherein step (d) is executed by an organic solvent treating method.

9. The method as claimed in claim 1, wherein step (d) further comprises the following steps of:
    (d1) supplying a container with an organic solvent therein;
    (d2) immersing the substrate with the at least one carbon nanotube array thereon into the organic solvent; and
    (d3) taking out the substrate form the organic solvent along a direction parallel to a surface of the substrate.

10. The method as claimed in claim 1, wherein step (d) further comprises the following steps of:
    (d1') providing a pressing device; and
    (d2') pressing the strip-shaped carbon nanotube array along a direction parallel to a surface of the substrate by the pressing device.

11. The method as claimed in claim 10, wherein the pressing device is a pressure head having a glossy surface.

12. The method as claimed in claim 1, wherein step (d) comprises the following steps of:
    (d1") supplying an air device; and
    (d2") applying an air current by the air device to the at least one carbon nanotube array along a direction parallel to a surface of the substrate with sufficient force to cause the strip-shaped carbon nanotube array to fall down on the substrate.

13. The method as claimed in claim 1, wherein the carbon nanotube film comprises a plurality of carbon nanotubes arranged along a same orientation.

14. The method as claimed in claim 13, wherein the carbon nanotubes have almost equal length, and are combined by van der Waals attractive force therebetween.

15. The method as claimed in claim 14, wherein the length of the carbon nanotubes ranges approximately from 1 millimeter to 10 millimeters.

* * * * *